United States Patent [19]

Dalton, Jr.

[11] Patent Number: 4,774,383

[45] Date of Patent: Sep. 27, 1988

[54] WATER TIGHT SEALS FOR ELECTRONICS PACKAGE

[76] Inventor: Murphy L. Dalton, Jr., 6035 Aberdeen, Dallas, Tex. 75230

[21] Appl. No.: 781,239

[22] Filed: Sep. 27, 1985

[51] Int. Cl.[4] .............................................. H05K 5/06
[52] U.S. Cl. ...................................... 174/50; 138/91;
174/52 S; 174/93; 220/307
[58] Field of Search ............... 174/50, 24, 68 C, 65 R,
174/65 SS, 65 G, 152 R, 93, 77 R, 52 S, 70 S,
72 R; 285/901, 918, 137.1, 347, 370, 356;
138/91, 89, 96 R; 277/180, 189, 188 R, 190,
101, 207 R, 207 A, 208; 220/307, DIG. 19, 86
R; 215/355, 364; 16/108; 29/451

[56] References Cited

U.S. PATENT DOCUMENTS

| 2,647,774 | 8/1953 | Newberry | 174/152 G |
| 2,958,723 | 11/1960 | Logan et al. | 174/93 X |
| 3,104,681 | 9/1963 | Gray, Jr. | 138/96 R |
| 3,120,967 | 2/1964 | Kazienko | 29/451 X |
| 4,172,212 | 10/1979 | Heinzer | 174/50 |
| 4,607,469 | 8/1986 | Harrison | 174/77 R |

FOREIGN PATENT DOCUMENTS 395309 2/1974 U.S.S.R. ............................... 215/355

Primary Examiner—A. T. Grimley
Assistant Examiner—David A. Tone
Attorney, Agent, or Firm—Richards, Harris, Medlock & Andrews

[57] ABSTRACT

Sealing assemblies (16, 18, 20) are disclosed for isolating electronic circuitry (14) within a magnetometer (12) from the effects of water intrusion when the magnetometer is used under water. The electronic circuitry (14) is positioned within an inner cylindrical member (24) and the ends of the inner cylindrical member are sealed by RTV rubber plugs (50, 52). Passages (54) through the plugs permit signal cables to extend from the electronic circuitry to the surface. The compression of the resilient plugs seals against the cable and the inner wall of the inner cylindrical member. Interior O-rings (46, 48) seal between the exterior of the inner cylindrical member and the inner wall of an outer cylindrical member (62) to seal the annular space therebetween. Couplings (66, 68) are secured at each end of the outer cylindrical member (62) and accept nipples (70, 72). Caps (78, 82) are slid over the nipples. Exterior O-rings (88, 90) are positioned on the outer surface of the nipples between facing chamfered seal surfaces on the coupling and cap and are squeezed into sealing engagement between the coupling, cap and nipple as exterior pressure is increased.

23 Claims, 2 Drawing Sheets

WATER TIGHT SEALS FOR ELECTRONICS PACKAGE

TECHNICAL FIELD

This invention relates to sealing an electronics package from water, and in particular to sealing a magnetometer for use under water to assure water tight integrity without excessive cost or complexity.

BACKGROUND OF THE INVENTION

Test equipment, and particularly equipment employing electronic circuitry, is often used in hostile environments. To insure the accuracy and reliability of the test equipment, it is frequently necessary to isolate the equipment from exposure to the environment. Furthermore, in addition to isolating the test equipment, provisions must be made to allow ready access to the equipment for servicing and repair. Also, cost will always be a factor in such an application.

The use of electronic circuitry in underwater exploration has been expanding for many years. This electronic circuitry must be protected from the effects of salt water when the circuitry is used in the ocean and must even be protected against contamination by rain, spray, bilge water and grime, all common factors on a seagoing vessel.

One particular electronic device used in underwater exploration is the magnetometer. This device is capable of detecting masses of ferrous metals in the ocean, on the ocean floor and even below the floor of the ocean. It is therefore a very useful instrument in detecting the location of objects underwater. However, such magnetometers must often be lowered from a ship or carried by divers to great depths within the ocean in order to provide adequate sensitivity. Even when a magnetometer can be ship mounted, it is frequently necessary to place it above water at the ship's bow where the effects of the boat's magnetic field and engine ignition noise are minimized, but the spray, breaking swells and rain as the ship drives through the ocean are most significant. Also, magnetometers require frequent service and maintenance and the electronics must be readily accessible. Therefore, a need exists for an apparatus and method to protect such electronic circuitry used underwater.

SUMMARY OF THE INVENTION

In accordance with one aspect of the present invention, an apparatus is disclosed for use underwater. The apparatus includes an inner cylindrical member defining an outer surface and an inner wall. First and second resilient plugs are provided for sealing the ends of the inner cylindrical member. Each of the plugs have a relaxed outer diameter larger than the inner diameter of the inner cylindrical member for insertion into an end of the inner cylindrical member to seal against the inner wall of the inner cylindrical member. An outer cylindrical assembly is provided which includes an outer cylindrical assembly that is sized to permit the inner cylindrical member to fit within the interior of the outer cylindrical member. First and second O-rings are positioned proximate opposite ends of the inner cylindrical member for sealing between the outer surface of the inner cylindrical member and inner wall of the outer cylindrical member. Structure is provided for supporting the O-rings to prevent motion of the O-rings along the elongate axis of one of the cylindrical members to allow the inner cylindrical member to be removed and repositioned within the interior of the outer cylindrical member. The outer cylindrical assembly defines an exterior cylindrical seal surface at each end thereof and a chamfered sidewall seal surface extending radially outward from the exterior cylindrical seal surface facing toward the adjacent open end of the cylindrical assembly. First and second exterior caps are used for placement over the ends of the outer cylindrical assembly to encapsulate the cylindrical members, the ends of the exterior caps placed over the outer cylindrical assembly having chamfered inner edges also defining seal surfaces. First and second exterior O-rings are provided, with each O-ring placed on the exterior cylindrical seal surface at an end of the outer cylindrical assembly for sealing engagement between the chamfered inner edge of the exterior cap and the sidewall seal to form a three point seal when the apparatus is exposed to an elevated pressure.

In accordance with another aspect of the present invention, the resilient plugs are formed with at least one passage through which a signal cable can pass, the compression of the resilient plug when fit within the inner cylindrical member creating a seal between the cable and plug along the passage. The resilient plug can be molded of RTV rubber.

In accordance with another aspect of the present invention, a method of making the resilient plugs is provided. The method includes the step of pouring uncured R-TV rubber into a mold having a cylindrical inner wall of greater diameter than the inner wall of the inner cylindrical member. The method further includes the step of positioning at least one cable section in the mold to form a passage through the cured RTV.

In accordance with another aspect of the present invention, the outer cylindrical assembly is formed by an outer cylindrical member, couplings secured to either end of the outer cylindrical member and nipples inserted in each of the couplings. The outer cylindrical surface of the nipples form the exterior cylindrical seal surface and the end of the coupling from which the nipple extends forms the chamfered side wall seal surface.

BRIEF DESCRIPTION OF THE DRAWINGS

Further objects and advantages of the invention will become more apparent from the following description and claims, and from the accompanying drawings, wherein:

DETAILED DESCRIPTION

Figure 1:
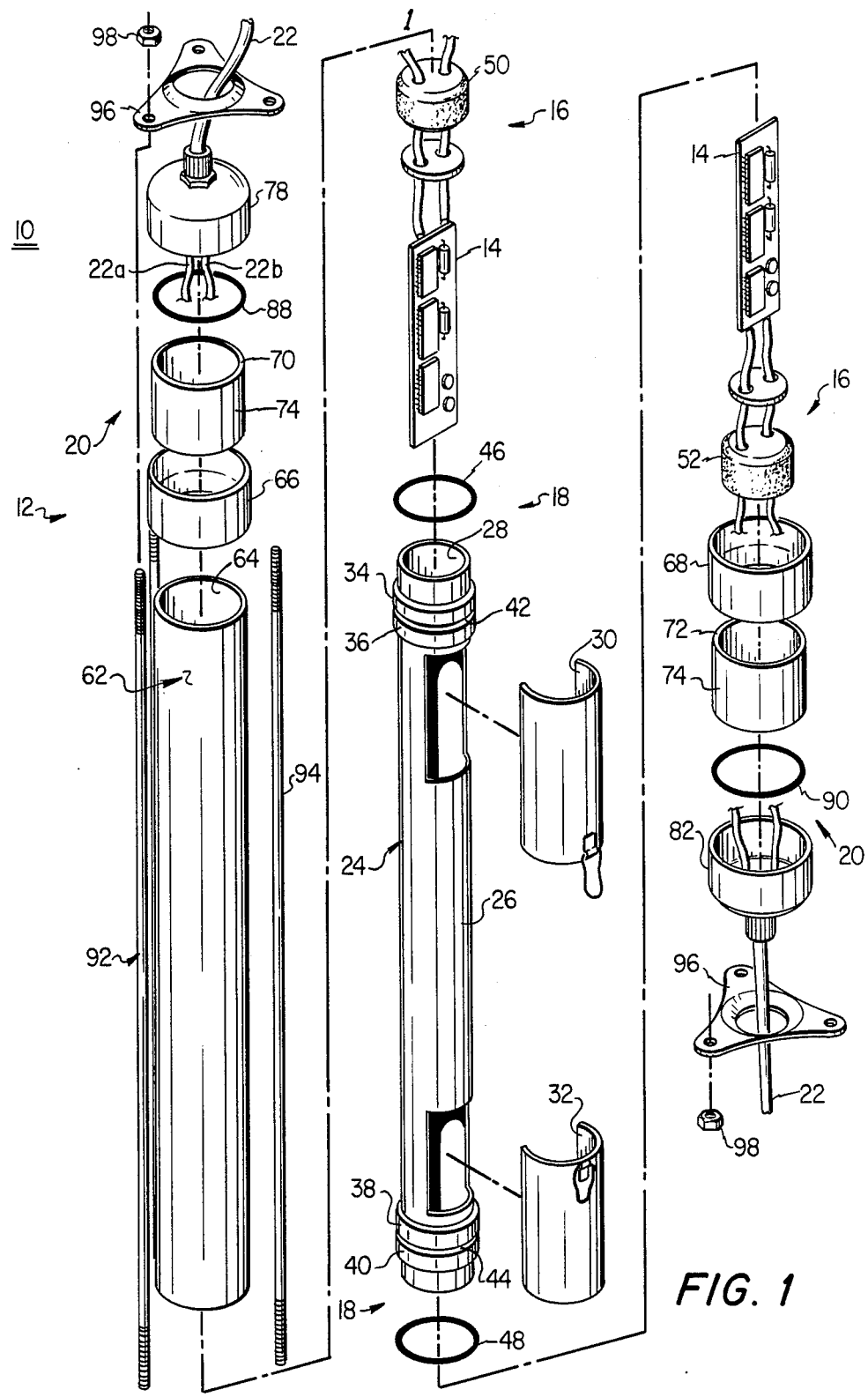
FIG. 1 is an exploded view of an apparatus for use underwater showing three novel seal assemblies, with the seals and apparatus forming a first embodiment of the present invention.
Figure 2:
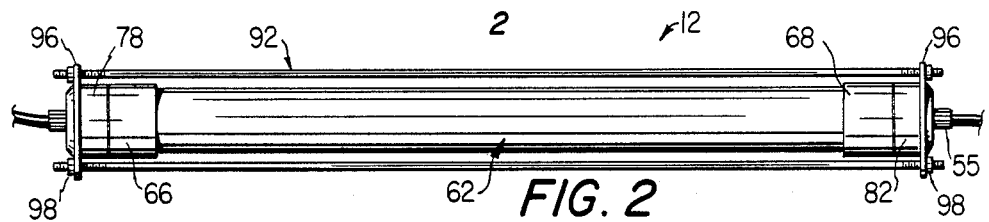
FIG. 2 is a side view of the apparatus illustrated in FIG. 1.

Referring now to the drawings in detail, wherein like numerals indicate like elements throughout the several views, and in particular to FIGS. 1–4, an apparatus 10 is disclosed which is intended for use in hostile environments, such as underwater. The particular apparatus 10 illustrated is a magnetometer 12 which is typically used underwater or mounted proximate the bow of a ship for sensing ferrous materials. The electronic circuitry 14 is positioned within the magnetometer 12 and isolated from environmental factors by three sealing assemblies 16, 18 and 20. A signal cable 22 connects the electronic circuitry 14 to shipboard mounted equipment for analyzing the signals generated by the circuitry 14.

The magnetometer 12 is provided with an inner cylindrical member 24 which has an outer cylindrical surface 26 and an inner wall 28. The electronic circuitry 14 is mounted within the interior of the inner cylindrical member 24 by any suitable structure, including adhesives, fasteners, etc. As best seen in FIG. 1, inspection covers 30 and 32 are provided along the length of the inner cylindrical member which can be removed to permit access to the circuitry located within.

First sealing assembly 16 seals the ends of the inner cylindrical member 24. However, provisions are made for signal cables to pass through this seal assembly from circuitry 14 to the exterior of magnetometer 12. The second sealing assembly 18 isolates the annular space between inner cylindrical member 24 and an outer cylindrical member 62 to prevent water from penetrating through inspection covers 30 and 32 into the circuitry 14. The third sealing assembly 20 seals the interior of the outer cylindrical member 62, and thus further isolates the circuitry 14 from the environment.

The second seal assembly 18 includes rings 34–40, O-rings 46 and 48, inner cylindrical member 24 and outer cylindrical member 62. Rings 34, 36, 38 and 40 are secured on the outer cylindrical surface 26 in pairs located proximate each end of the inner cylindrical member 24 as best seen in FIG. 1. Each pair of rings 34, 36, 38 and 40 are slightly separated to form gaps 42 and 44. Gap 42 will accept a first interior O-ring 46 and gap 44 will accept a second interior O-ring 48. The use of rings 34–40 therefore provide one technique for forming a groove to receive an O-ring without the need for forming a groove in inner cylindrical member 24. However, if desired, such a groove can be formed in inner cylindrical member 24 to support the O-rings. Rings 34–40 can be selectively slidable along the member 24 to allow the width of gaps 42 and 44 to be varied to permit different O-rings sizes to be used.

Figure 3:
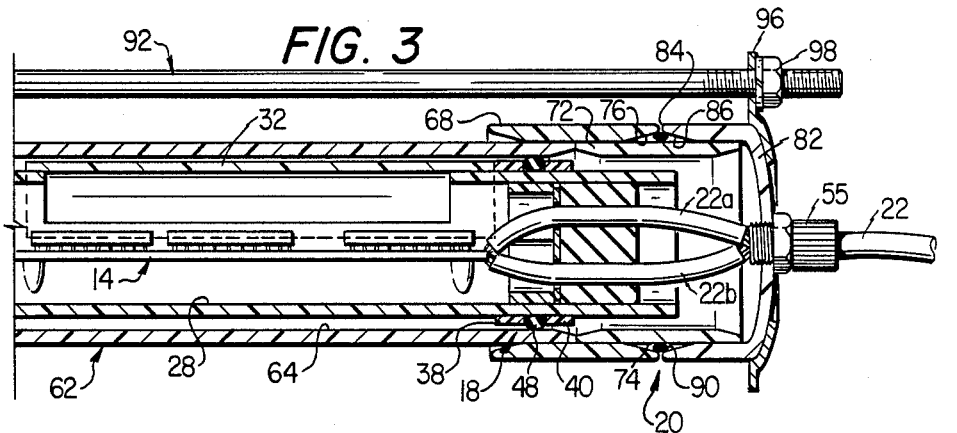
FIG. 3 is a partial cutaway of the apparatus of FIG. 1 illustrating the novel seals.
Figure 4A:
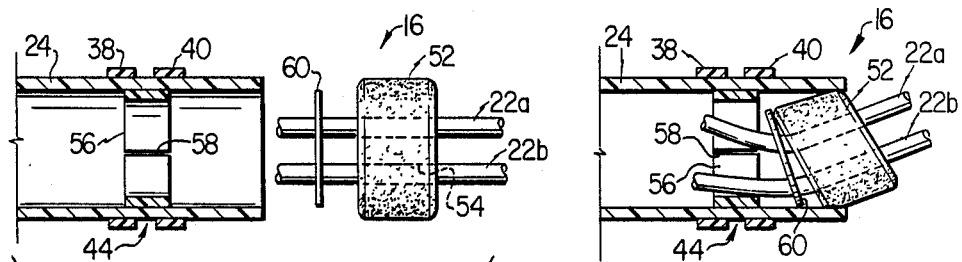
FIGS. 4a and 4b illustrate the insertion of the resilient plug within the interior of the inner cylindrical member.
Figure 4B:
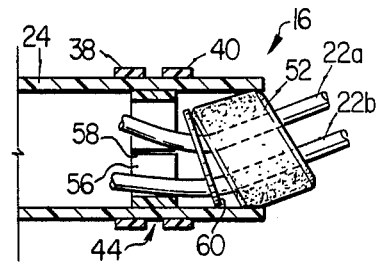

The first seal assembly includes plugs 50 and 52 and inner cylindrical member 24. A first resilient plug 50 is provided for sealing a first end of the inner cylindrical member 24 and a second resilient plug 52 is provided to seal the opposite, second end of the inner cylindrical member. Each of the resilient plugs is formed of a resilient material which has a relaxed outer diameter that exceeds the inner diameter of the inner cylindrical member 24 so that when the plugs are fit within the ends of the inner cylindrical member, a seal is created between the outer cylindrical surface of the plugs and the inner wall 28 of the inner cylindrical member 24. As best illustrated in FIGS. 4a and 4b, the ends of the plugs 50 and 52 are preferably chamfered to ease insertion of the plugs within the inner cylindrical member 24 and resist tearing or chipping of the plug. Preferably, the plugs are inserted at a slope as shown in 4b and then forced upright to form the seal, as shown in FIG. 3. A lubricant can be used if desired to ease the fit. The plugs 50 and 52 are formed with two passages 54 to allow cable portions 22a and 22b to extend from the electronic circuitry 14 outside the inner cylindrical member 24. The passages are sized so that when the plugs are inserted within the inner cylindrical member 24, the plugs are compressed around the cable sections 22a and 22b to form a seal with the outside of the cable portions along the entire length of the passage 54. The signal cables 22 pass outside of magnetometer 12 through the end caps 78 and 82 and are sealed by conventional cable seals 55 using compressed O-rings.

It can thus readily be seen that the plugs 50 and 52 will resist entry of moisture and other contaminants into the interior of the inner cylindrical member 24. However, the plug is held from movement along the inner wall solely by the friction existing between the plug and the inner wall. If used in particularly high pressure environments, it may be desirable to provide structure for preventing inward movement of the plug. One such structure is illustrated in FIGS. 3 and 4 and includes a short pipe section 56 of substantially identical configuration to the inner cylindrical member and which has a slot 58 cut therethrough. The nipple in 56 is then squeezed to close the slot 58 to permit the nipple to be slid into the interior of the inner cylindrical member 24. The natural resiliency of the section 56 causes the section to expand outward in a friction fit with the inner wall 28, which can be supplemented by an adhesive or fastener between the section and member 24. A thin, strong disk 60 can then be placed between the plug and section 56 with the outer edge of the disk bearing against the edge of the section 56 facing the plug, with the entire disk distributing the force acting on the plug evenly across the entire end surface of the plug. The section 56 and disk 60 will thus prevent the plug from sliding inward and the force acting on the plug will simply cause the plug to expand outward to provide an even tighter seal against the inner wall 28 and the cable sections 22a and 22b passing through the plug. In an alternate design, a snap ring groove could be formed in the inner wall 28 of inner cylindrical member 24. A snap ring could be placed in this groove with the ring extending radially inward from the inner wall 28 to support a disk 60 and thus one of the plugs 50 and 52 from being forced further into the interior of the inner cylindrical member under the influence of external pressure. The pipe section 56 need not be used in this alternate design. However, a snap ring could also be used to support a pipe section 56 if further support is desired. The outer cylindrical member 62 is provided with dimensions to permit the inner cylindrical member to be slid within the interior of the outer cylindrical member 62 as seen in FIG. 3. The first and second interior O-rings 46 and 48 are selected so that the O-rings will seal between the outer surface of the inner cylindrical member 24 and the inner wall 64 of the outer cylindrical member 62. The O-rings 46 and 48 and associated sealing surfaces thus form the second sealing assembly 18. The second sealing assembly 18 will resist moisture and other contaminants from migrating from exterior the ends of the inner cylindrical member 24 to the annular space between the members 24 and 62, and thereby through the inspection covers 30 and 32, which are not pressure sealed, into the electronic circuitry 14. In addition to forming an effective seal, the second sealing assembly 18 will facilitate ready servicing by permitting the inner cylindrical member 24 to be slid out from the interior of the outer cylindrical member 62 without difficulty. The O-rings 46 and 48 will remain within the gaps 42 and 44 and the seal can be reestablished by simply sliding the inner cylindrical member 24 back into the outer cylindrical member 62.

The third seal assembly 20 is formed by outer cylindrical member 62, couplings 66 and 68, nipples 70 and 72, O-rings 88 and 90 and caps 78 and 82. Coupling 66 is secured in a water-tight manner to one end of the outer cylindrical member 62 and couplings 68 is similarly secured to the opposite end of member 62 when outer cylindrical member 62 and coupling 66 and 68 are formed of PVC pipe, the couplings are preferably cement bonded or welded to the member 62. Couplings 66 and 68 are preferably of the type where the inner walls thereof taper radially outward from the center of the coupling in order to press fit onto the member that the coupling is joined with. Nipple 70 is inserted into the coupling 66 opposite member 62 while a similar nipple 72 is inserted into the coupling 68. The nipples 70 and 72 preferably have the same inner and outer diameters as the outer cylindrical member 62 and differ only in their length from member 62. As best seen in FIGS. 1 and 3, the nipples 70 and 72 will be seen to form exterior cylindrical seal surfaces 74 proximate the couplings. The inner edges of the ends of the couplings facing away from the outer cylindrical member 62 define chamfered side wall seal surfaces 76 which extend generally radially outward from the sealing surfaces 74 immediately adjacent to surfaces 74. The first cap 78 can be slid over nipple 70 with the end 80 thereof facing the side wall seal surface 76 of coupling 66. The second cap 82 can be similarly slid over nipple 72 so that the end 84 thereof faces the side wall seal surface 76 of coupling 68. Ends 80 and 84 also preferably have chamfered inner edges which define seal surfaces 86.

A first exterior O-ring 88 is placed on the exterior cylindrical sealing surface 74 of nipple 70 between seal surface 76 on coupling 66 and seal surface 86 on first cap 78. When the first cap 78 is urged toward the coupling 66, as when the magnetometer 12 is exposed to high pressure under water, the first exterior O-ring will form a three point seal against surfaces 74, 76 and 86. The greater the exterior pressure, the greater the force that will compress the first exterior O-ring 88 against the sealed surfaces. A second exterior O-ring 90 is positioned about the exterior cylindrical sealing surface 74 of nipple 72 for forming a similar three point seal between second cap 82, nipple 72 and coupling 68.

If the cylindrical members 24 and 62 are short enough, and the interior depths of caps 78 and 82 are deep enough to totally enclose the members when the caps are positioned end to end with the members within, a single exterior O-ring could be used to seal the interiors of the members. In such a construction, the exterior O-ring would seal against the exterior of the outer cylindrical member and the chamfered inner edges of the facing ends of the caps to again form a three point seal.

To assure an adequate seal prior to immersion of the magnetometer 12, a clamp assembly 92 can be employed which urges the caps 78 and 82 into sealing engagement. The clamp assembly 92 includes three threaded rods 94 which extend the entire length of the magnetometer and triangularly shaped end plates 96. The threaded rods pass through holes in the plates 96 and are secured thereto by nuts 98. By threading the nuts 98 onto the threaded rods 94, the plates 96 can be urged against the caps 78 and 82 to form seals with O-rings 88 and 90 to prevent moisture and contaminants from entering the magnetometer 12. Exposing the magnetometer 12 to elevated pressures, as by lowering the magnetometer into the ocean, will simply increase the force acting on the caps and increase the sealing force exerted by O-rings 88 and 90. If desired, any other structures to provide some precompression of O-rings 88 and 90 can be used instead of clamp assembly 92, including simply wrapping tape about the magnetometer to compress O-rings 88 and 90.

The third sealing assembly 20 is intended to be effective to depths of several hundred feet within the ocean. The three-way pinch on the O-rings of third seal assembly 20 increases as the longitudinal compression on magnetometer 12 increases as a result of increased external pressure. The third seal assembly therefore resists lateral or shear pressure forces acting along the length of the magnetometer which could cause normal piston-cylinder O-ring seals acting between only two surfaces to fail. The first and second sealing assemblies 16 and 18 are intended to have three purposes. First, they form a pressure resistant water barrier in addition to the third sealing assembly 20 so that if sealing assembly 20 fails, leakage can be sensed visually or electronically before the pressure rises to the level needed to cause failure of the first and second sealing assemblies 16 and 18. Such a leak can be detected visually as bubbles usually rise from a leaking magnetometer as the water leaking in forces air from the magnetometer. An electronic leak transducer can be used to detect a leak electronically. Because electronics are particulary vulnerable when exposed to salt water, and because of human error, such duplication of seals is particularly useful. Secondly, the sealing assemblies 16 and 18 form an effective barrier against rain, ocean spray, bilge water, grime and other contaminants when the third sealing assembly 20 is not in place as when the magnetometer is being stored on board ship. Third, the smooth cylindrical outer surface of the inner cylindrical member 24 forms a convenient substrate for foil or shim stock which can act to enhance the already existing electronic shielding and which could be used as a ground point external to the housing if a battery is positioned within the magnetometer. The first and second sealing assemblies 16 and 18 are therefore not intended to withstand the same level of pressures as third sealing assembly 20 when apparatus 10 comprises a magnetometer 12. The O-rings 46 and 48 should not be so compressed between the inner an outer cylindrical members so that an operator would find it overly difficult to remove the inner cylindrical member by sliding it out of the interior of the outer cylindrical member to service the electronic circuitry 14. By limiting the compression of the O-rings 46 and 48 in this manner, the O-rings will not support excessive lateral forces along the elongate axes of the cylindrical members. However, thicker O-rings 46 and 48 can be employed which would increase the pressure resistance of the second sealing assembly 18 to a level equal to or even greater than the third sealing assembly 20. Also, structure to prevent plugs 50 and 52 from being pushed into the inner cylindrical member 24, such as pipe section 56 and disk 60, can be used to form a first seal assembly 16 of comparable pressure resistance to third seal assembly 20. Also, additional second sealing assemblies 18 can be provided between the inner and outer cylindrical members if desired to increase the pressure resistance of second seal assembly 18.

In the preferred embodiment, the inner and outer cylindrical members 24 and 62 are formed by common off-the-shelf PVC pipe and plugs 50 and 52 are formed of RTV (room temperature vulcanizing) rubber. For example, in one magnetometer 12 constructed in accordance with the teachings of the present invention, the inner cylindrical member 24 was formed of schedule 40 pipe of 1¼" diameter. The outer cylindrical member 62 was formed by schedule 40 pipe of 2" diameter. The couplings 66 and 68, nipples 70 and 72 and caps 78 and 82 can thus also comprise off-the-shelf PVC pipe accessories. One particular advantage of use of the PVC accessories is the fact that the caps are manufactured with the chamfered inner edge at their ends which form seal surfaces 86. Furthermore, PVC couplings are manufactured with radially outward tapered inner walls which taper from the center as with couplings 66 and 68 and also have a chamfered inner edge at their ends to form sidewall seal surfaces 76.

Figure 5:
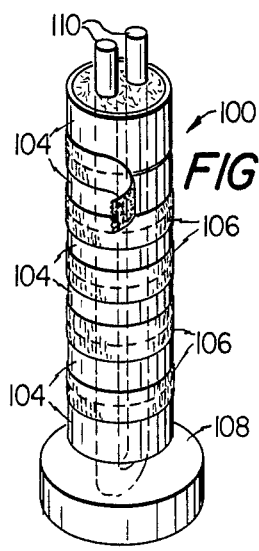
FIG. 5 is a perspective view of one mold for making the resilient plugs.
Figure 6:
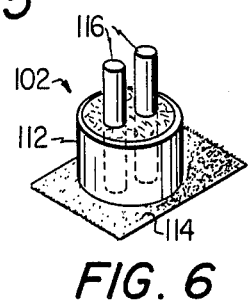
FIG. 6 illustrates a second mold for making the resilient plugs.

FIGS. 5 and 6 illustrate two techniques for forming the plugs 50 and 52 out of RTV rubber. Mold 100, illustrated in FIG. 5, is designed to form a number of plugs simultaneously. Mold 102, illustrated in FIG. 6 is used to form a single plug.

Mold 100 has a series of mold rings 104 stacked vertically. If the inner cylindrical member 24 is a schedule 40 PVC pipe, the molding rings 104 can be formed of sections of the same diameter class 200 PVC pipe which has a thinner wall and therefore a larger inner diameter. When the RTV rubber is molded within the rings 104, the outside diameter of the resulting RTV plugs is thus slightly larger than the inner diameter of the inner cylindrical member 24 for a proper interference fit.

The molding rings 104 are secured in a vertical stacked position by adhesive tape 106 which tapes the abutting edges together. A base 108 seals the bottom ring to prevent liquid RTV rubber from running out of the mold until the rubber vulcanizes. A cable section 110 is looped through the molds to form the passages in the molded plugs.

Liquid RTV rubber is poured into the mold 100 to the very top of the uppermost molding ring 104. The rubber is allowed to vulcanize at room temperature until it has solidified. The adhesive tape 106 is then removed and a knife is used to cut the individual plugs by slicing the solidified rubber into pieces between the molding rings.

The mold 102 incorporates a single molding ring 112 which rests on adhesive paper 114. The mold ring 112 is stuck to the adhesive paper 114 to sufficient degree to prevent leakage of the liquified RTV rubber around the lower lip of the molding ring. Two cable sections 116 are oriented vertically within the ring and can be supported at their upper end by any convenient structure, including adhesive tape taped about the cable sections and to the rigg. Liquid RTV rubber is then poured into the mold ring 112 and permitted to harden to form a plug.

Figure 7:
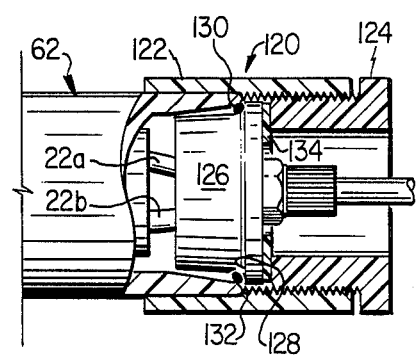
FIG. 7 is a partial cross-sectional view of an alternate sealing assembly.

A first modification of the third sealing assembly 20 is illustrated in FIG. 7, and identified as sealing assembly 120. A number of elements in this modification are identical to those described above and are identified by the same reference numerals in FIG. 7. A threaded coupling 122 is secured at either end of the outer cylindrical member 62. The threaded couplings 122 are provided with a threaded portion on their inner wall for receiving a threaded nut 124. A plug 126, having a chamfered seal surface 128 and an O-ring seal 130, is urged against the end of the outer cylindrical member by threading the plug 126 into the threaded coupling 122. By tightening the nut 124 sufficiently, the O-ring is compressed between seal surface 128 on the plug 126 and the chamfered inner surface at the end of the outer cylindrical member 62 which forms a second seal surface 132 to prevent entry of moisture or contaminants. A Teflon washer 134 is preferably positioned between nut 124 and plug 126 to reduce the torsional force on plug 126 when tightening nut 124.

While several embodiments of the present invention have been illustrated in the accompanying drawings and described in the foregoing detailed description, it will be understood that the invention is not limited to the embodiments disclosed but is capable of numerous rearrangements, modifications and substitutions of parts and elements without departing from the spirit of the invention.

I claim:

1. An apparatus for use under water comprising:
   an inner cylindrical member defining an outer surface and an inner wall;
   resilient first and second plugs, each of the plugs having a relaxed outer diameter layer than the inner diameter of the inner cylindrical member, said plugs being inserted in opposite ends of the inner cylindrical member to seal against the inner wall of the inner cylindrical member;
   an outer cylindrical assembly including an outer cylindrical member having the inner cylindrical member within the interior of the outer cylindrical member;
   first and second interior O-rings positioned proximate opposite ends of the inner cylindrical member on the outer surface thereof for sealing between the outer surface and the inner wall of the outer cylindrical member;
   means for supporting said first and second interior O-rings to prevent motion of said interior O-rings along the elongate axis of one of the cylindrical members to allow the inner cylindrical member to be removed from and repositioned within the interior of the outer cylindrical member;
   said outer cylindrical assembly defining an exterior cylindrical seal surface at each end thereof and a side wall seal surface extending radially outward from proximate each exterior cylindrical seal surface facing toward the adjacent open end of the outer cylindrical assembly;
   first and second exterior caps placed over the ends of the outer cylindrical assembly to encapsulate the interiors of the cylindrical members, the ends of the exterior caps placed over the outer cylindrical assembly having chamfered inner edges; and
   first and second exterior O-rings each placed on the exterior cylindrical seal surface at opposite ends of the outer cylindrical assembly for sealing engagement between the chambered edge of the exterior cap, the exterior cylindrical seal surface and the side wall seal surface when the apparatus is exposed to an elevated pressure.

2. The apparatus of claim 1 wherein said inner and outer cylindrical members are formed of PVC pipe.

3. The apparatus of claim 2 wherein said outer cylindrical assembly further includes a PVC coupling bonded to each end of the outer cylindrical member, each coupling having a radially outwardly tapering inner wall, and a PVC nipple inserted part way into each of the couplings, the exterior surface of the nipples forming the exterior cylindrical seal surface and the chamfered inner edge of the end of the coupling forming the side wall seal surface.

4. The apparatus of claim 1 further comprising means for urging the first and second exterior caps onto the outer cylindrical assembly to precompress the exterior O-rings to form seals prior to submergence under water.

5. The apparatus of claim 1 wherein each of said plugs has at least one passage formed therethrough to permit a signal cable to pass from the interior of the inner cylindrical member, the passage being sized so that as the plug is inserted in the inner cylindrical member, the plug is compressed against the signal cable to form a seal between the plug and signal cable along the passage.

6. The apparatus of claim 1 wherein said means for supporting the interior O-rings comprise a pair of PVC rings fit over the outer surface of the inner cylindrical member with a gap therebetween to contain the interior O-ring.

7. The apparatus of claim 1 further comprising means positioned in the interior of the inner cylindrical member to prevent said first and second plugs from being pushed further into the interior under the influence of an elevated pressure.

8. The apparatus of claim 7 wherein said preventing means comprise a PVC pipe section of similar dimensions to the inner cylindrical member with the PVC pipe section having a cut therethrough to permit the pipe section to be inserted within the interior of the inner cylindrical member for frictional engagement with the inner wall thereof and a disk supported on the edge of the PVC pipe section facing the adjacent plug to prevent the plug from moving further into the interior of the inner cylindrical member.

9. An apparatus, comprising:
a cylindrical member, the cylindrical member having a predetermined inner diameter and an inner wall, and further having ends
a first resilient plug having a relaxed outer diameter larger than the inner diameter of the cylindrical member, said first resilient plug inserted in a first end of the cylindrical member to seal against the inner wall of the cylindrical member at the first end, the relaxed outer diameter of the first resilient plug being sufficiently larger than the inner diameter of the cylindrical member to require the first resilient plug to be tilted into the first end to form a sufficiently tight seal to resist intrusion of ocean spray and pressurized fluid;
a second resilient plug having a relaxed outer diameter larger than the inner diameter of the cylindrical member inserted in the opposite, second end of the cylindrical member to seal against the inner wall of the cylindrical member at the second end, the relaxed outer diameter of the second resilient plug being sufficiently larger than the inner diameter of the cylindrical member to require the second resilient plug to be tilted into the second end to form a sufficiently tight seal to resist intrusion of ocean spray and pressurized fluid;
the frictional engagement between said first and second plugs and the inner wall of the cylindrical member resisting an elevated pressure outside the cylindrical member to isolate the interior of the cylindrical member.

10. The apparatus of claim 9 wherein said plugs each have at least one passage formed therethrough to permit a signal cable to extend from the interior of the cylindrical member, the passage being sized so that when the plug is inserted within the end of the cylindrical member, the plug is urged in sealing engagement against the cable along the length of the passage.

11. The apparatus of claim 9 wherein said sealing assembly further comprises means inserted in the interior of the cylindrical member to prevent the first and second plugs from moving further into the interior of the cylindrical member under the influence of an elevated pressure exterior the cylindrical member.

12. The apparatus of claim 11 wherein said cylindrical member is formed of PVC pipe and said means for preventing movement of the plugs include a section of PVC pipe of the same diameter and wall thickness dimensions as the cylindrical member, the section having a cut formed therethrough along its length so that the pipe section can be inserted within the interior of the cylindrical member and expand into frictional engagement with the inner wall thereof to form a barrier to prevent the plug from moving further into the interior of the cylindrical member.

13. The sealing assembly of claim 9 wherein said plugs are formed of RTV rubber.

14. An apparatus comprising:
an outer cylindrical member;
an inner cylindrical member within the interior of the outer cylindrical member, the inner cylindrical member having an exterior cylindrical surface and said outer cylindrical member having an inner wall;
means positioned proximate opposite ends of the inner cylindrical member for defining gaps about the outer circumference of the inner cylindrical member to support an O-ring at each end of the inner cylindrical member and to prevent movement along the length of the inner cylindrical member, the gaps being defined exterior the outer circumference of the inner cylindrical member;
first and second O-rings, one O-ring positioned in each of the gaps formed at opposite ends of the inner cylindrical member and sealing between the outer cylindrical surface of the inner cylindrical member and inner wall of the outer cylindrical member; and
said means for supporting the O-rings comprising first and second elements between the inner wall of the outer cylindrical member and the exterior cylindrical surface of the inner cylindrical member and secured to one of said members, said elements spaced a predetermined distance apart to form the gap therebetween.

15. An apparatus, comprising:
an outer cylindrical member;
an inner cylindrical member within the interior of the outer cylindrial member, the inner cylindrical member having an exterior cylindrical surface and said outer cylindrical member having an inner wall;
means positioned proximate opposite ends of the inner cylindrical member for defining gaps about the outer circumference of the inner cylindrical member to support an O-ring at each end of the inner cylindrical member and to prevent movement along the length of the inner cylindrical member;

first and second O-rings, one O-ring positioned in each of the gaps formed at the opposite ends of the inner cylindrical member and sealing between the outer cylindrical surface of the inner cylindrical member and the inner wall of the outer cylindrical member;

said means for supporting the O-rings comprising first and second rings secured on the exterior cylindrical surface of the inner cylindrical member spaced a predetermined distance apart to form the gap therebetween.

16. The apparatus of claim 15 wherein at least one of the rings is moveable along the length of the inner cylindrical member to vary the gap to permit use of a range of O-ring sizes.

17. An apparatus, comprising:

an outer cylindrical member;

an inner cylindrical member within the interior of the outer cylindrical member, the inner cylindrical member having an exterior cylindrical surface and said outer cylindrical member having an inner wall;

means positioned proximate opposite ends of the inner cylindrical member for defining gaps about the outer circumference of the inner cylindrical member to support an O-ring at each end of the inner cylindrical member and to prevent movement along the length of the inner cylindrical member;

first and second O-rings, one O-ring positioned in each of the gaps formed at the opposite ends of the inner cylindrical member and sealing between the outer cylindrical surface of the inner cylindrical member and the inner wall of the outer cylindrical member;

said inner and outer cylindrical members comprising PVC pipe and said means for supporting the O-rings comprise PVC pipe sections secured to the outer cylindrical surface of the inner cylindrical member and spaced apart to form the gap.

18. A sealing assembly comprising: a cylindrical member, a coupling secured to each end of the cylindrical member, each coupling having an inner wall tapered radially outward from the cylindrical member and a chamfered inner edge at the end spaced from the cylindrical member;

a nipple inserted in each of the couplings for engagement with the chamfered inner edge thereof, the nipple having, a cylindrical exterior surface;

a cap in sliding engagement over the exposed portion of each of the nipples, the inner edge of the end of the caps being chamfered; and an O-ring positioned on the outer cylindrical surface of each nipple for engagement with the outer cylindrical surface of the nipple and the chamfered edges on the cap and coupling when the sealing assembly is exposed to an elevated external pressure which acts to urge the cap onto the nipple and compress the O-ring on three surfaces to form a seal.

19. The sealing assembly of Claim 18 wherein said cylindrical member is a PVC pipe, said coupling is a PVC coupling, said nipple is a PVC nipple, and the cap comprising a PVC cap, the PVC cap and coupling being manufactured with the chamfered edges.

20. A sealing assembly comprising: a cylindrical member, a coupling secured at each end of the cylindrical member, the coupling having an inner threaded portion;

a plug having an annular seal surface;

an O-ring for positioning between the annular seal surface of the plug and a chamfered inner edge at the end of the cylindrical member; and a threaded nut for engagement with the threaded portion of the coupling to urge the plug toward the end of the cylindrical member to compress the O-ring between the annular seal surface and the chamfered edge of the cylindrical member to form the seal.

21. A sealing assembly comprising:

a cylindrical assembly;

a cylindrical exterior seal surface formed on said cylindrical assembly;

an O-ring positioned on the cylindrical exterior seal surface;

means on said cylindrical assembly defining a seal surface extending radially outward from the cylindrical exterior seal surface; and a cap fit over the end of the cylindrical assembly and having a chamfered inner edge to define a seal surface, the cap being urged onto the cylindrical assembly to compress the O-ring between the seal surfaces to form a seal at the end when the cap and cylindrical assembly are exposed to an external elevated pressure.

22. A method for assembling an apparatus resistant to the intrusion of ocean spray and pressurized fluid, comprising the steps of:

tilting a first resilient plug into a first end of a cylindrical member to seal against the inner wall of the cylindrical member at the first end, the first resilient plug having a relaxed outer diameter larger than the inner diameter of the cylindrical member, to form a sufficiently tight seal to rssist intrusion of ocean spray and pressurized fluid;

tilting a second resilient plug into a second end of the cylindrical member to seal against the inner wall of the cylindrical member at the second end, the relaxed outer diameter of the second resilient plug being larger than the inner diameter of the cylindrical member, to form a sufficiently tight seal to resist intrusion of ocean spray and pressurized fluid, the frictional engagement between said first and second plugs and the inner wall of the cylindrical member resisting an elevated pressure outside the cylindrical member to isolate the interior of the cylindrical member.

23. The method of claim 22 wherein said plugs each have at least one passage formed therethrough, further comprising the step of:

inserting a signal cable through each passage prior to inserting the plug within the end of the cylindrical member, the compression of the plug inserted in an end of the cylindrical member causing the plug to be urged into sealing engagement against the signal cable along the length of passage.

* * * * *